US008138780B2

(12) United States Patent
Pan

(10) Patent No.: US 8,138,780 B2
(45) Date of Patent: Mar. 20, 2012

(54) LCD PANEL APPARATUS AND TESTING METHOD USING THE SAME

(75) Inventor: Ying Hao Pan, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 778 days.

(21) Appl. No.: 12/325,716

(22) Filed: Dec. 1, 2008

(65) Prior Publication Data

US 2009/0315817 A1 Dec. 24, 2009

(51) Int. Cl.
*G01R 31/00* (2006.01)
(52) U.S. Cl. .............................. 324/760.01; 324/762.01
(58) Field of Classification Search ........................ None
See application file for complete search history.

(56) References Cited

U.S. PATENT DOCUMENTS 7,394,449 B2 * 7/2008 Moon ........................... 345/102
7,687,808 B2 * 3/2010 Umezaki ......................... 257/72

FOREIGN PATENT DOCUMENTS

| | | |
|---|---|---|
| CN | 101000736 | 7/2007 |
| JP | 58139397 | 8/1983 |
| JP | 2002350896 | 12/2002 |

* cited by examiner

*Primary Examiner* — Vinh Nguyen
(74) *Attorney, Agent, or Firm* — WPAT, P.C.; Anthony King

(57) ABSTRACT

An LCD panel apparatus comprises a pixel array, a first common electrode terminal, a second common electrode terminal, a plurality of first current directional devices and a plurality of second current directional devices. The pixel array comprises a plurality of common lines. Each first current directional device is connected in series between a first side of each common line and the first common electrode terminal. Each second current directional device is connected in series between a second side of each common line and the first common electrode terminal. The second common electrode terminal is connected between the first side of each common line and each first current directional device. The current flows through each common line in a single direction so as to detect any defects in the common line. The testing method for the LCD panel apparatus includes the steps of: providing a first current directional device and connecting the first current directional device in series between a first side of each common line and a first common electrode terminal; providing a second current directional device and connecting the second current directional device in series between a second side of each common line and the first common electrode terminal; providing a second electrode terminal and electrically connecting the second electrode terminal between each first current directional device and the first side of each common line; and supplying different voltages to the first common electrode terminal and the second common electrode terminal, thereby the current flows through each common line in a same direction during testing.

10 Claims, 6 Drawing Sheets

LCD PANEL APPARATUS AND TESTING METHOD USING THE SAME

BACKGROUND OF THE INVENTION (A) Field of the Invention

The present invention relates to a liquid crystal display (LCD) panel apparatus and testing method thereof, and more specifically, to an LCD panel apparatus and testing method thereof for detecting whether any defects exist in common lines.

(B) Description of Related Art

LCDs have many advantages such as thin panel, light weight, low power consumption and low radiation, and therefore have been widely used in current display applications. An LCD display mainly includes an LCD panel and a back light unit. The back light unit serves as illumination source to the LCD panel, and the rotations of the liquid crystals are controlled by electrical signals so as to display images.

The quality of LCD panels significantly impacts the display performance. In order to ensure the quality of the LCD panels, the LCD panels need to be tested, so as to detect whether defects exist.

FIG. 1 shows a pixel array circuit of a known LCD panel. In an LCD panel apparatus 10, scan lines 12 and data lines 13 are interlaced in a transverse direction and a longitudinal direction, respectively, so as to form a pixel array 11 including a plurality of pixel cells 19. Common lines 14 are connected to the plurality of pixel cells 19 in a transverse direction. Each pixel cell 19 includes a pixel electrode 15 and a storage capacitor 16 connected between the common line 14 and the pixel electrode 15. Moreover, a TFT transistor 17 is connected to the corresponding scan line 12, the pixel electrode 15 and data line 13.

When performing the pixel array defect testing, an array common electrode terminal 18 is conductive to the common lines 14 in a two-way manner, i.e., the two ends of each electrode line 14 are connected to the array common electrode terminal 18, so as to receive the signals from the array common electrode terminal 18. Moreover, the common lines 14 are further connected to an IC signal input for receiving common electrode signals during the module stage after testing.

Referring to FIG. 2, the arrow signs indicate current flowing direction when testing the common electrodes. Because array common electrode terminal 18 is conductive to the common lines 14 in a two-way manner, the testing current flows from two ends to the centers of the common lines 14. However, according to this known structure, if the common lines 14 have any open circuit due to defect existence, the open-circuit defect cannot be detected because currents in the common lines 14 flow into the common lines 14 from the two ends thereof. As a result, the panel quality would be seriously impacted.

SUMMARY OF THE INVENTION

To resolve the above-mentioned problems, the present invention provides an LCD panel apparatus and the testing method thereof, so as to detect any defects in the common lines to ensure the quality of LCD panels.

According to a first aspect of the present invention, an LCD panel apparatus is disclosed. The LCD panel apparatus includes a pixel array, a first common electrode terminal, a second common electrode terminal, a plurality of first current directional devices and a plurality of second current directional devices. Each of the first current directional devices is connected between a first side of each of the common lines and the first common electrode terminal. Each of the second current directional devices is connected between a second side of each of the common lines and the first common electrode terminal. The second common electrode terminal is connected to each of the first current directional devices and the first side of each of the common lines. The currents in the common lines flow in a same direction to detect any defects in the common lines.

In an embodiment, the first and second current directional devices are diodes. The first current directional devices inhibit the currents flowing from the second common electrode terminal to the first common electrode terminal through the first current directional devices. The second current directional devices inhibit the current flowing from the second side of the common lines to the first common electrode terminal through the second current devices. Accordingly, currents flow from the first side to the second side of the common lines while testing.

According to the second aspect of the present invention, a method for testing an LCD panel apparatus is disclosed. The LCD panel includes a pixel array and a first common electrode terminal. The testing method is used for detecting any defects in the common lines of the pixel array, and is performed as follows. A first current directional device is connected in series between a first common electrode terminal and a first side of each common line. A second current directional device is connected in series between the first common electrode terminal and a second side of each common line. A second electrode terminal is electrically connected between each first current directional device and the first side of each common line. During testing, different voltages are applied to the first common electrode terminal and the second common electrode terminal, thereby ensuring the currents flow through the common lines in a same direction.

According to the present invention, the problem that defects in the common lines cannot be identified due to the use of double side driving manner can be effectively resolved. In addition, it is not necessary to change the driving voltages of the common electrodes that are inputted by an IC after testing, and the panel still can operate normally.

DETAILED DESCRIPTION OF THE INVENTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
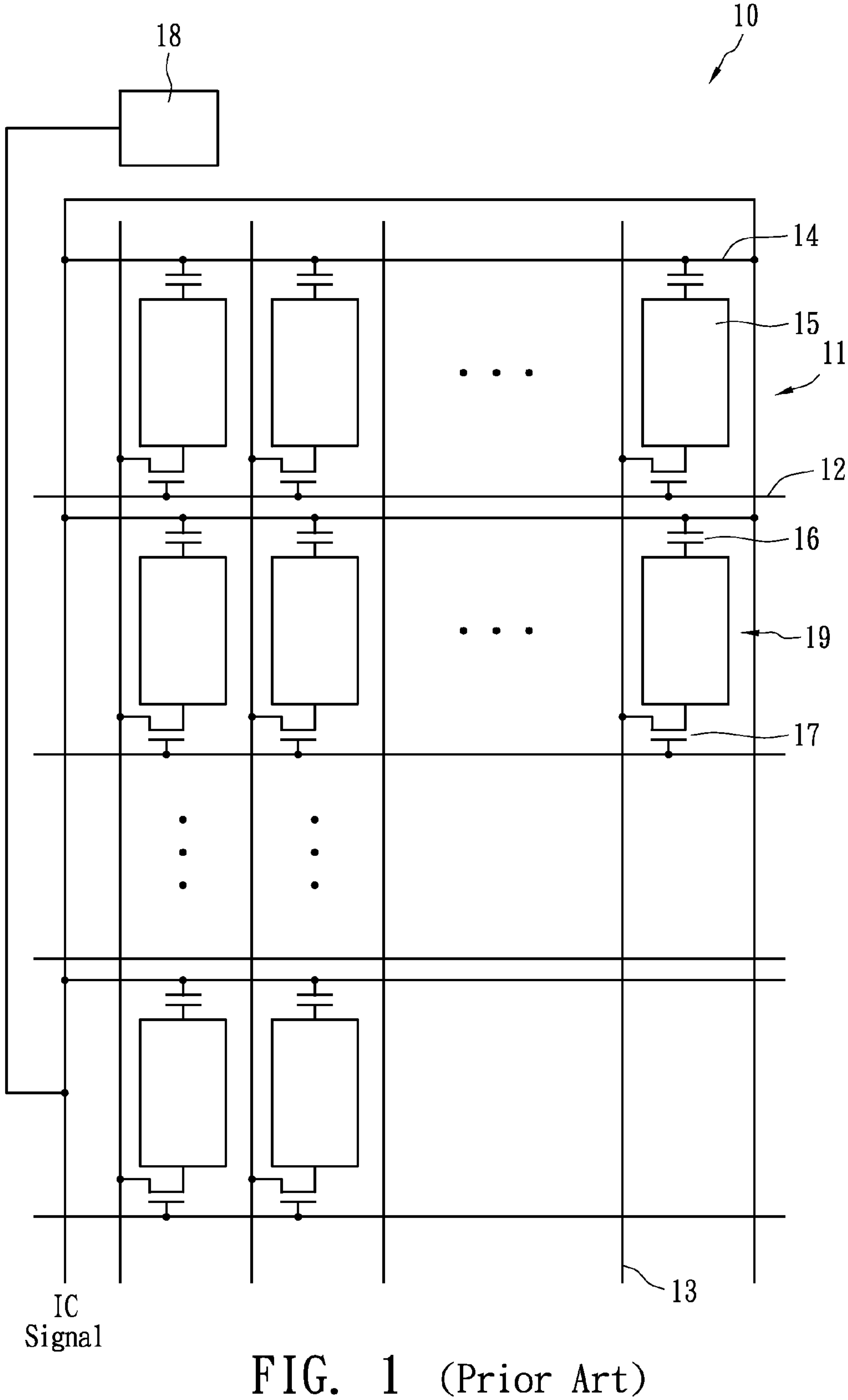
FIG. 1 (Prior Art)
FIG. 1 illustrates a known LCD panel apparatus.
Figure 2:
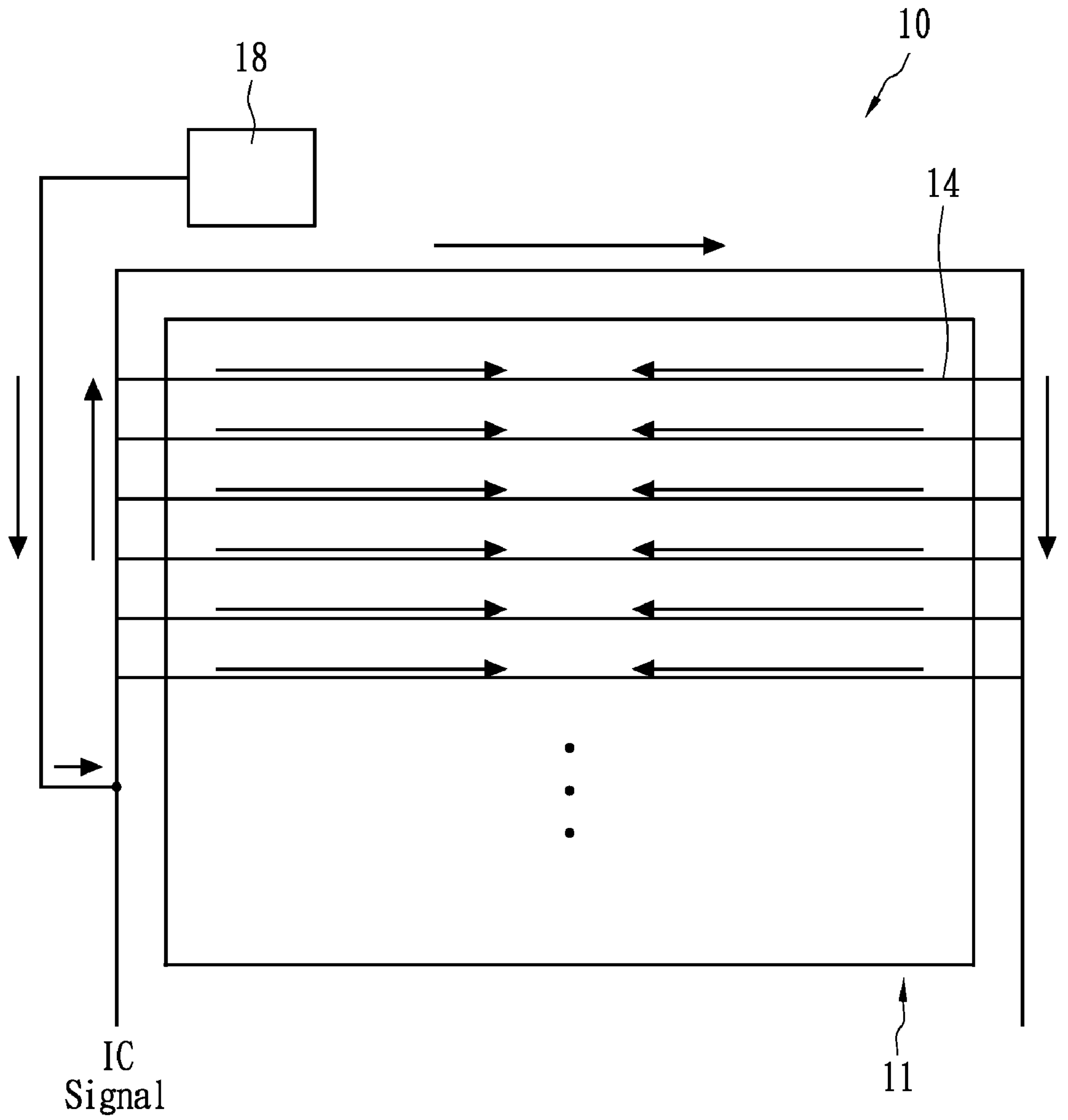
FIG. 2 (Prior Art)
FIG. 2 illustrates current flow directions of common lines of a known LCD panel apparatus.
Figure 3:
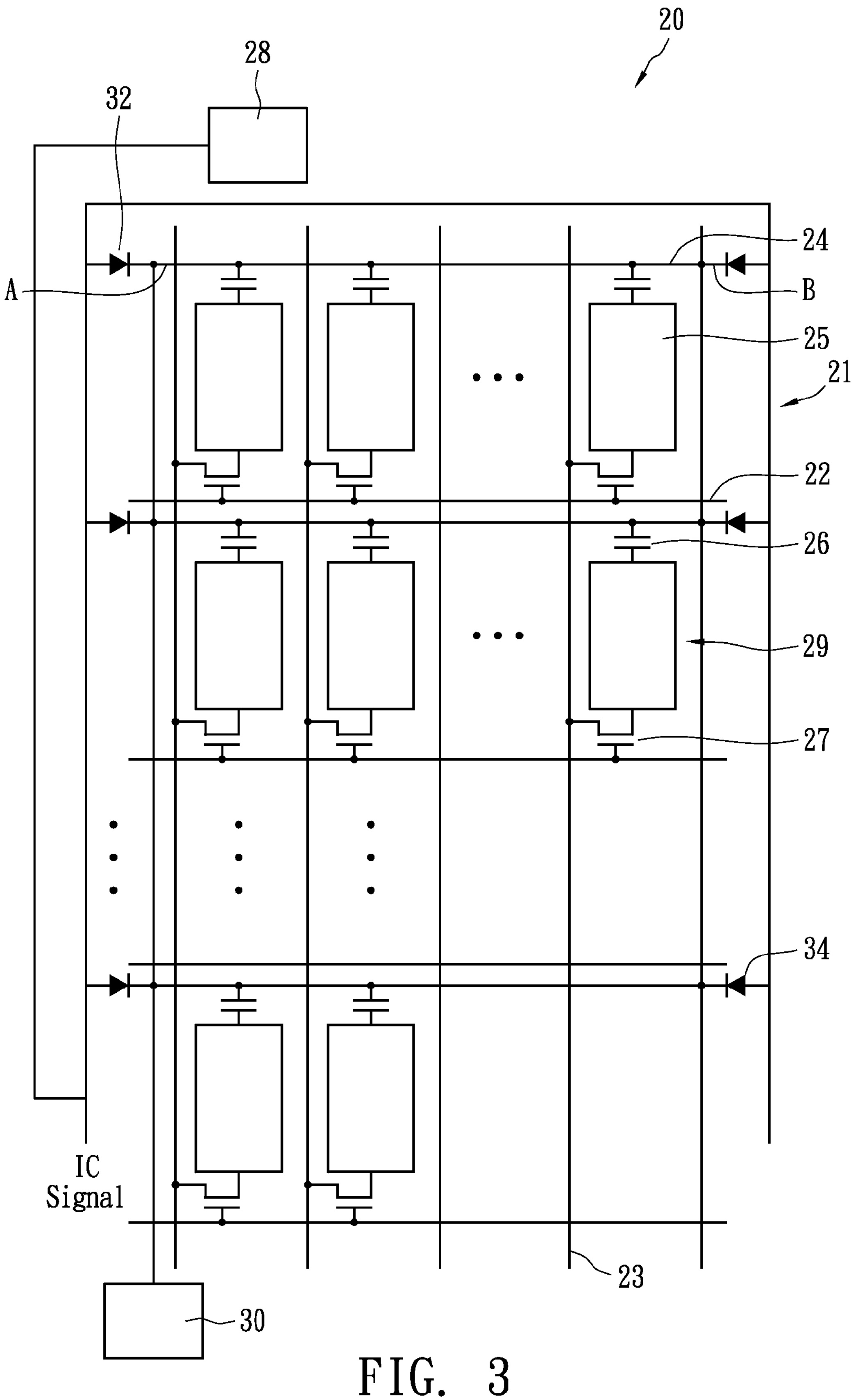
FIG. 3 illustrates an LCD panel apparatus in accordance with the present invention.

FIG. 3 illustrates an LCD panel apparatus in accordance with the present invention. In an LCD panel apparatus 20, scan lines 22 and data lines 23 are interlaced in a transverse direction and a longitudinal direction, respectively, so as to form a pixel array 21 including a plurality of pixel cells 29. Moreover, the common lines 24 are transversely connected to the plurality of pixel cells 29. Each pixel cell 29 includes a pixel electrode 25, and a storage capacitor 26 is connected between the common line 24 and the pixel electrode 25. A TFT transistor 27 is connected to the scan line 22, the data lines 23.

The first common electrode terminal 28 is connected to two ends of each of the common lines 24. In other words, the two ends of each of the common lines 24 are connected to the first common electrode terminal 28. The common lines 24 are connected to an IC signal input for receiving common electrode signals during the module stage after testing.

In addition to the known first common electrode terminal 28, a second electrode terminal 30 is connected to a first side A of each of the common lines 24.

Moreover, a current directional device 32 is connected in series between a first side A of each common line 24 and the first common electrode terminal 28. More specifically, a second common electrode terminal 30 is connected between each current directional device 32 and the first side A of each of the common lines 24. A current directional device 34 is connected between a second side B of each of the common lines 24 and the first common electrode terminal 28. In this embodiment, the current directional devices 32 and 34 may include at lease one diode; the positive electrode of the current directional device 32 is connected to first common electrode terminal 28, and the negative electrode of the current directional device 32 is connected to the first side A of each of the common lines 24. The positive electrode of the current directional device 34 is connected to the first common electrode terminal 28, and the negative electrode of the current directional device 34 is connected to the second side B of each of the common lines 24. Because a diode functions as a short circuit at forward bias and an open circuit at backward bias, each current directional device 32 inhibits the current in the corresponding common line 24 flowing from the second common electrode terminal 30 to the first common electrode terminal 28 through the current directional device 32. Each second current directional device 34 inhibits the current in the corresponding common line 24 flowing from the second side B of the common line 24 to the first common electrode terminal 28 through the second current device 34.

Figure 4:
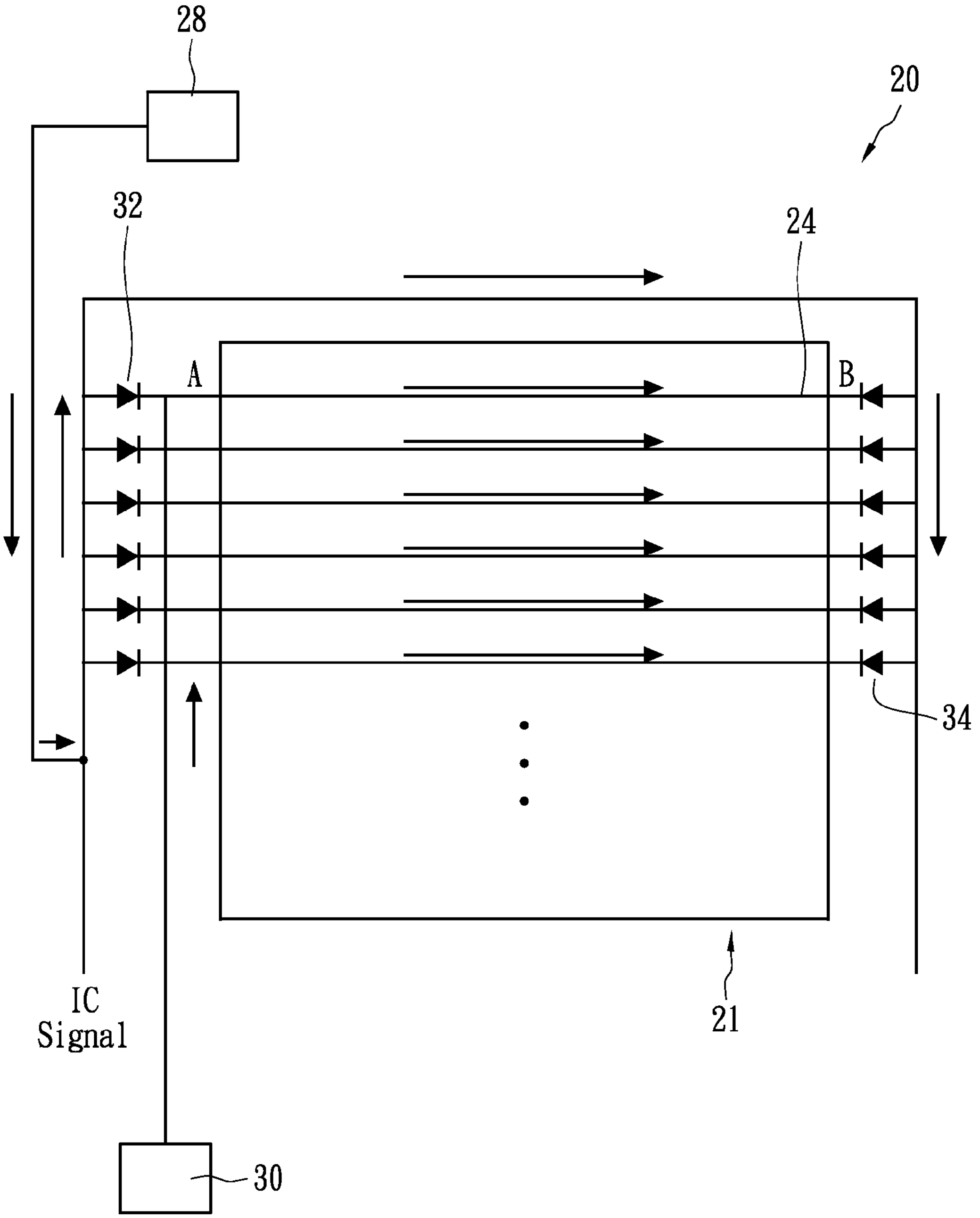
FIG. 4 illustrates current flow directions of common lines of the LCD panel apparatus in accordance with the present invention.

In an embodiment, −25V is supplied to the first common electrode terminal 28, and −15V is supplied to the second common electrode terminal 30. At the first side A of each of the common lines 24, the voltage level of the first common electrode terminal 28 is lower than that of the second common electrode terminal 30. In other words, two ends of each current directional device 32 are of a backward bias, so that the current directional devices 32 are turned off and functions as an open circuit. The current from the second common electrode terminal 30 is blocked by the current directional devices 32, and therefore cannot flow back to the first common electrode terminal 28. Likewise, at the second side B of each of the common lines 24, the voltage level of the first common electrode terminal 28 is lower than that of the side B of each common line 24, i.e., the two ends of each current directional device 34 is of a backward bias. Therefore, the current directional devices 34 are turned off and functions as an open circuit. The currents on the common lines 24 are blocked by the current directional devices 34, and therefore cannot flow toward the first common electrode terminal 28. As a result, the second common electrode terminal 30 provides a test signal during testing, and the currents in the common lines 24 flow in a same direction as shown in the arrow signs in FIG. 4. Accordingly, the currents of the common lines of the test apparatus of the present invention flow in a same direction, e.g., from the first side A to the second side B of each common line 24, so as to effectively resolve the problem that open-circuit in the common lines cannot be detected for the case using double side driving design.

Figure 5:
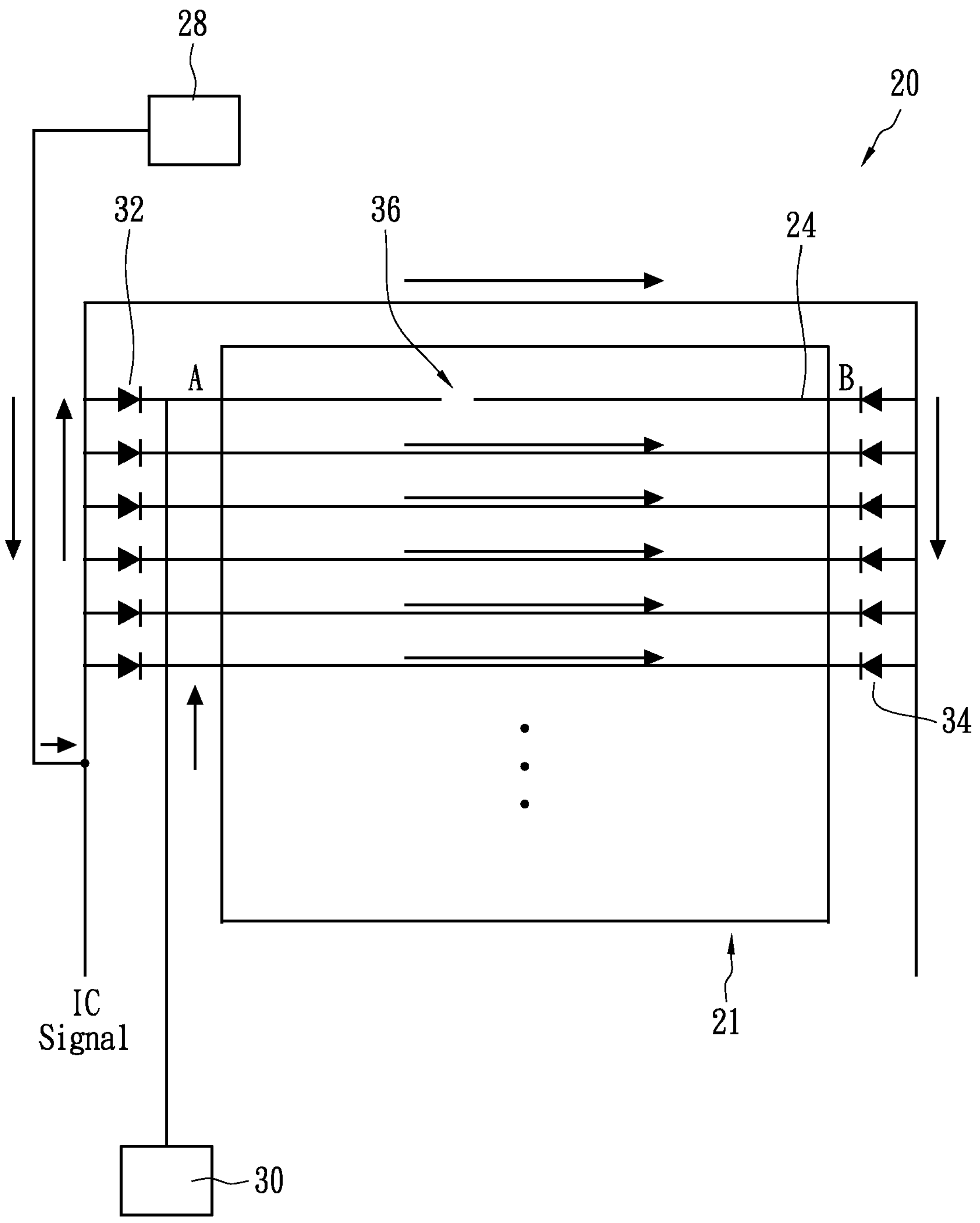
FIG. 5 illustrates current flow directions of common lines having an open circuit of the LCD panel apparatus in accordance with the present invention.

As shown in FIG. 5, given that there are any defects in the common lines 24 of a display area, e.g., an open circuit 36 shown in FIG. 5. Because the test signals provided by the second common electrode terminal 30 can only flow from the first side A to the second side B of the common lines 24, the test signals cannot flow through the open circuit 36 and cannot flow from the second side B of the common line 24 to the pixel array 21, so that the defect of the common line 24 can be detected successfully. After testing, the first common electrode terminal 28 and the second common electrode terminal 30 are cut. When a driving signal of IC is input to the common electrode, for example, 5V, the driving signal will not be affected by the current directional devices 32 and 34 and can be normally transmitted to the common lines 24. As such, two sides of the panel receive the common electrode signals and do not be affected in the driving mode.

According to this embodiment, the second common electrode terminal 30 and the current directional devices 32 and 34 restrict the current directions of testing signals. The current directional devices 32 and 34 are turned off in this embodiment. Nevertheless, the present invention is not limited to the embodiments. The people having ordinary knowledge can adequately allocate the current directional devices 32 and 34 and supply adequate voltages to the first common electrode terminal 28 and the second common electrode terminal 30.

Figure 6:
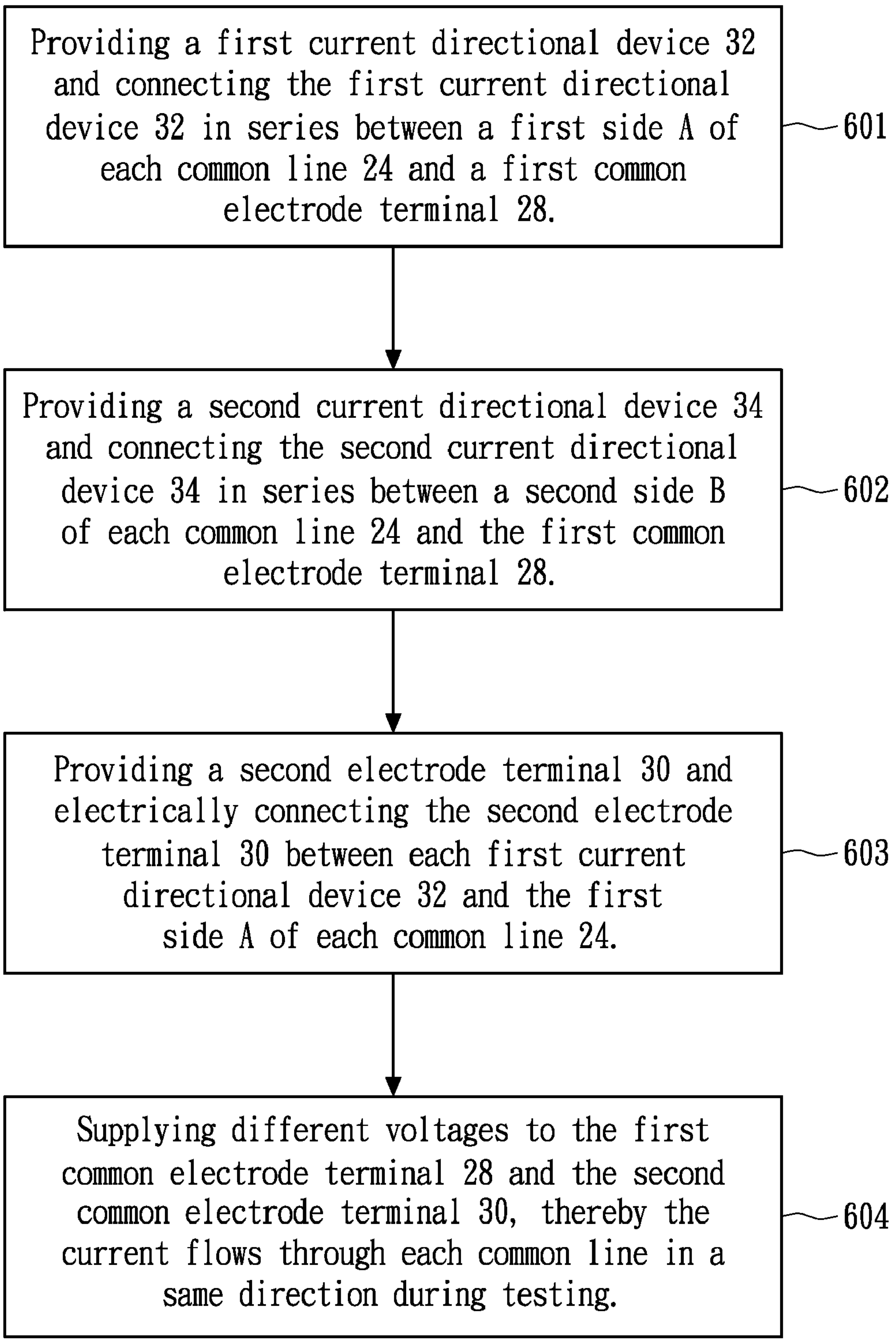
FIG. 6 illustrates the test method of an LCD panel apparatus in accordance with the present invention.

FIG. 6 illustrates a test method for an LCD panel apparatus. The LCD panel is similar to the above-mentioned LCD panel 20. Referring to FIGS. 5 and 6, the test method is used for detecting any defects in the common lines 24 of the pixel array 21, and includes the following steps.

Step 601: providing a first current directional device 32 and connecting the first current directional device 32 in series between a first side A of each common line 24 and a first common electrode terminal 28.

Step 602: providing a second current directional device 34 and connecting the second current directional device 34 in series between a second side B of each common line 24 and the first common electrode terminal 28.

Step 603: providing a second electrode terminal 30 and electrically connecting the second electrode terminal 30 between each first current directional device 32 and the first side A of each common line 24.

Step 604: supplying different voltages to the first common electrode terminal 28 and the second common electrode terminal 30, thereby the current flows through each common line in a same direction during testing.

In Step 604, when supplying different voltages to the first common electrode terminal 28 and the second common electrode terminal 30, the voltages to the second common electrode terminal 30 may include a test signal, and the voltage level of the first common electrode terminal 28 is lower than that of the test signal of the second common electrode terminal 30, so that the current in each common line 24 flows from the first side A to the second side B of the common line 24.

The above-described embodiments of the present invention are intended to be illustrative only. Numerous alternative embodiments may be devised by those skilled in the art without departing from the scope of the following claims.

What is claimed is:

1. A liquid crystal display (LCD) panel apparatus, comprising:

a pixel array comprising a plurality of common lines;

a first common electrode terminal;

a plurality of first current directional devices, each of the plurality of the first current directional devices being connected in series between a first side of each of the common lines and the first common electrode terminal;

a plurality of second current directional devices, each of the plurality of the second current directional devices being connected in series between a second side of each of the common lines and the first common electrode terminal; and a second common electrode terminal connected between each of the first current directional devices and the first side of each of the common lines;

wherein currents flowing through each of the common lines are in a same direction to detect any defects in the common lines.

2. The LCD panel apparatus of claim 1, wherein the first and second current directional devices comprise diodes.

3. The LCD panel apparatus of claim 1, wherein a voltage level of the first common electrode terminal is lower than a voltage level of the second common electrode terminal while testing.

4. The LCD panel apparatus of claim 1, wherein an end of each of the first current directional devices connecting to the first common electrode terminal is further connected to an IC signal input to receive common electrode signals.

5. An LCD panel apparatus, comprising:

a pixel array comprising a plurality of pixels;

a first common electrode terminal;

a second common electrode terminal; and a plurality of common lines connected to common electrodes of the pixels, a first side of each of the common lines extending out of the pixel array and being connected to a first current directional device in series, and a second side of each of the common lines extending out of the pixel array and being connected to a second current directional device in series;

wherein a first end of each of the first current directional devices is connected to the first common electrode terminal, a second end of each of the first current directional devices is connected to the first side of each of the common lines and the second common electrode terminal, a first end of each of the second current directional devices is connected to the second side of each of the common lines, and a second end of each of the second current directional devices is connected to the first common electrode terminal;

by setting the first current directional devices and the second current directional devices, currents in each of the common lines flow from the first side to the second side of each of the common lines to detect any defect in the common lines.

6. The LCD panel apparatus of claim 5, wherein a voltage level of the first common electrode terminal is lower than a voltage level of the second common electrode terminal while testing.

7. A testing method for LCD panel apparatus, the LCD panel comprising a pixel array and a first common electrode terminal for detecting any defects in common lines of the pixel array, the testing method comprising:

(a) providing a first current directional device and connecting the first current directional device in series between a first side of each of the common lines and the first common electrode terminal;

(b) providing a second current directional device and connecting the second current directional device in series between a second side of each of the common lines and the first common electrode terminal;

(c) providing a second common electrode terminal electrically connected between each of the first current directional devices and the first side of each of the common lines; and (d) supplying different voltages to the first common electrode terminal and the second common electrode terminal, thereby currents flowing through each of the common lines are in a same direction.

8. The testing method of claim 7, wherein in step (d) the current flowing through each of the common lines goes from the first side to the second side of each of the common lines.

9. The testing method of claim 7, wherein in step (d) a voltage level of the first common electrode terminal is lower than a voltage level of the second common electrode terminal while testing.

10. The testing method of claim 7, wherein in step (d) the second common electrode terminal provides a test signal while testing.

* * * * *